United States Patent
Zeisel et al.

(10) Patent No.: US 10,651,342 B2
(45) Date of Patent: May 12, 2020

(54) OPTOELECTRONIC SEMICONDUCTOR CHIP

(71) Applicant: OSRAM OLED GmbH, Regensburg (DE)

(72) Inventors: Roland Zeisel, Tegernheim (DE); Michael Binder, Regensburg (DE); Jens Ebbecke, Rohr in Niederbayern (DE); Tobias Meyer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/315,463

(22) PCT Filed: Jul. 11, 2017

(86) PCT No.: PCT/EP2017/067409
§ 371 (c)(1),
(2) Date: Jan. 4, 2019

(87) PCT Pub. No.: WO2018/011211
PCT Pub. Date: Jan. 18, 2018

(65) Prior Publication Data
US 2019/0259911 A1      Aug. 22, 2019

(30) Foreign Application Priority Data
Jul. 14, 2016   (DE) .......................... 10 2016 112 972

(51) Int. Cl.
*H01L 33/22*   (2010.01)
*H01L 33/02*   (2010.01)
*H01L 33/06*   (2010.01)

(52) U.S. Cl.
CPC ............ *H01L 33/22* (2013.01); *H01L 33/025* (2013.01); *H01L 33/06* (2013.01); *H01L 2933/0083* (2013.01)

(58) Field of Classification Search
CPC combination set(s) only.
See application file for complete search history.

(56) References Cited

U.S. PATENT DOCUMENTS

| 6,410,942 B1 * | 6/2002 | Thibeault | H01L 33/38 257/88 |
| 8,174,039 B2 * | 5/2012 | Kao | H01L 33/20 257/98 |

(Continued)

OTHER PUBLICATIONS

Kim, G., et al., "Improved internal quantum efficiency of GaN-based light emitting diodes using p-AlGaN trench in multi-quantum well," Japanese Journal of Applied Physics, vol. 53, No. 6S, May 28, 2014, pp. 1-4.

(Continued)

*Primary Examiner* — Matthew L Reames
(74) *Attorney, Agent, or Firm* — Slater Matsil, LLP

(57) ABSTRACT

An optoelectronic semiconductor chip is disclosed. In an embodiment an optoelectronic semiconductor chip includes a semiconductor body comprising a first semiconductor structure, a second semiconductor structure and an active region between the first and the second semiconductor structure and a plurality of recesses, each penetrating at least one of the semiconductor structures and the active region, wherein a cover surface of the active region is a continuous surface, and wherein at least in some of the recesses, surfaces of the recesses are completely covered with an electrically insulating material.

18 Claims, 6 Drawing Sheets

(56) References Cited

U.S. PATENT DOCUMENTS

| | | |
|---|---|---|
| 2003/0141507 A1 | 7/2003 | Krames et al. |
| 2013/0228742 A1 | 9/2013 | Tanaka et al. |
| 2015/0069443 A1 | 3/2015 | Reboud et al. |
| 2016/0027978 A1 | 1/2016 | Shih |

OTHER PUBLICATIONS

Lan, W., et al., "ICP-induced defects in GaN characterized by capacitance analysis," Solid-State Electronics, vol. 50, Issues 11-12, Nov.-Dec. 2006, pp. 1677-1681.
Sizov, D., et al., "Carrier Transport in InGaN MQWs of Aquamarine- and Green-Laser Diodes," IEEE Journal of Selected Topics in Quantum Electronics, vol. 17, No. 5, Sep./Oct. 2011, pp. 1390-1401.
Zhou, W.D., et al., "Electrically injected single-defect photonic bandgap surface-emitting laser at room temperature," Electronics Letters, vol. 36, No. 18, Aug. 31, 2000, pp. 1541-1542.

\* cited by examiner

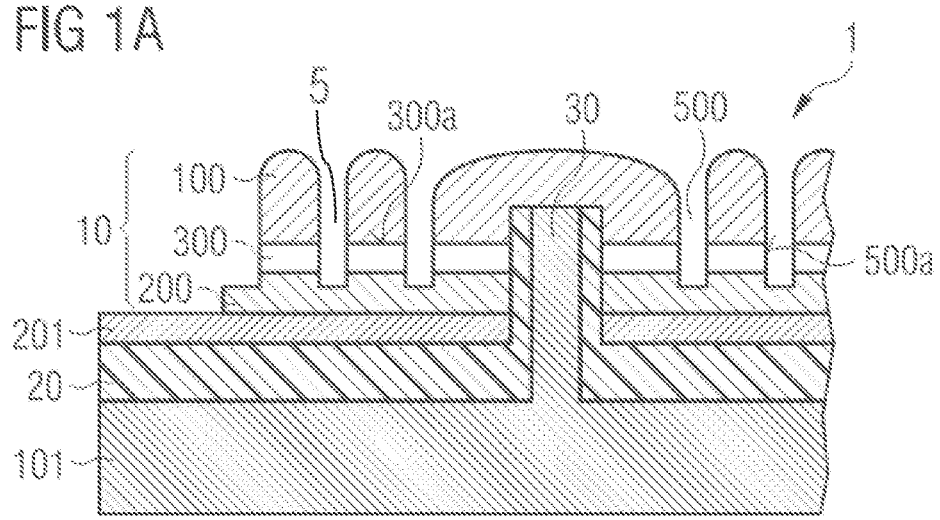
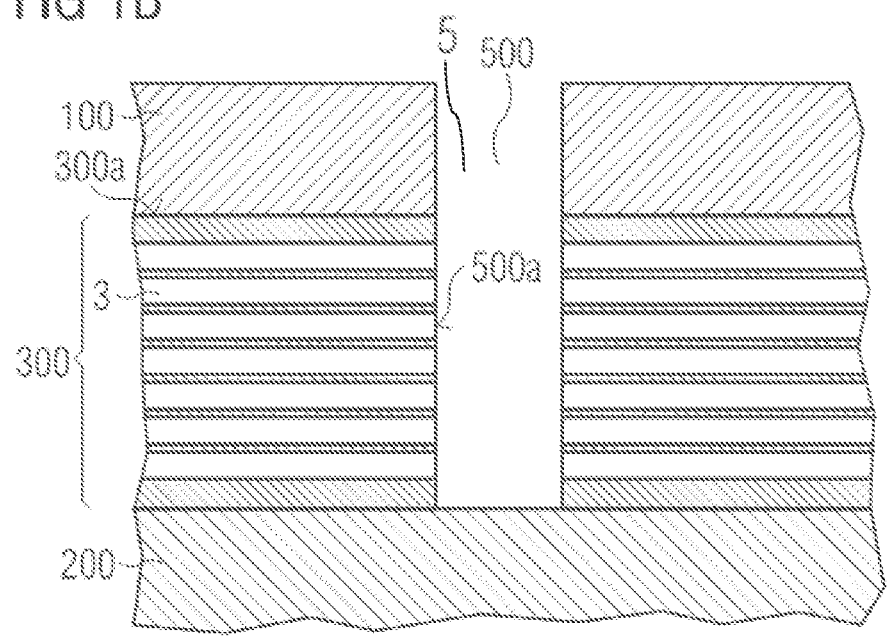

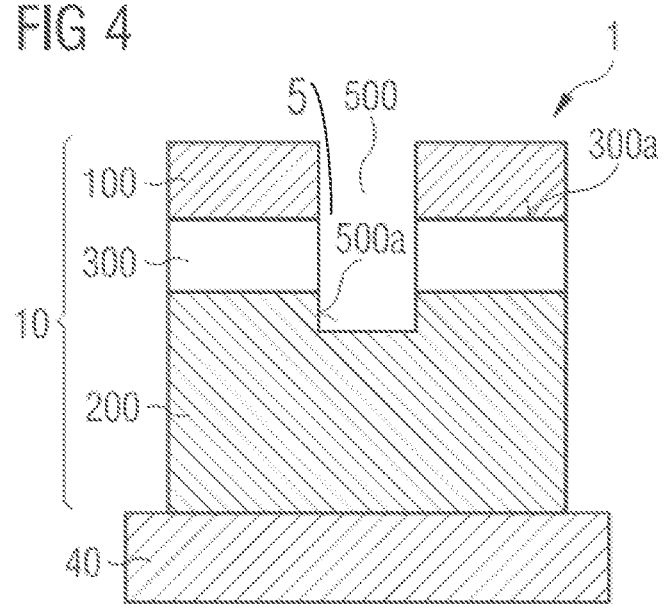
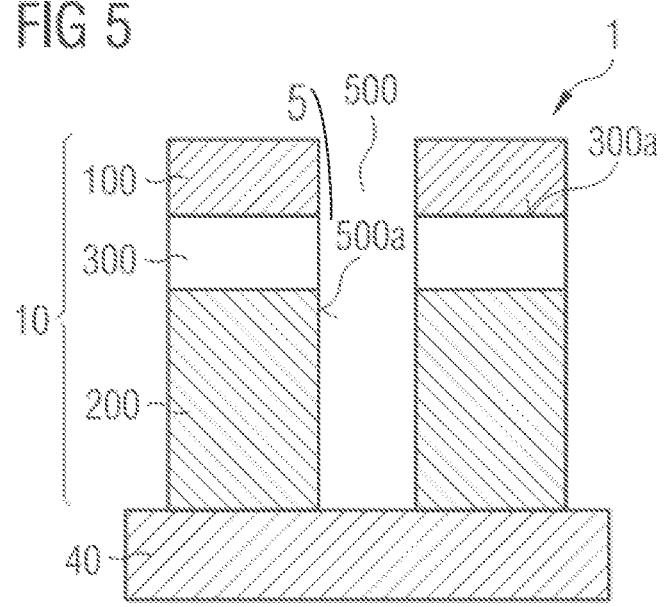

OPTOELECTRONIC SEMICONDUCTOR CHIP

This patent application is a national phase filing under section 371 of PCT/EP2017/067409, filed Jul. 11, 2017, which claims the priority of German patent application 10 2016112972.0, filed Jul. 14, 2016, each of which is incorporated herein by reference in its entirety.

TECHNICAL FIELD

An optoelectronic semiconductor chip is specified.

SUMMARY OF THE INVENTION

Embodiments provide an optoelectronic semiconductor chip which has an improved efficiency.

In various embodiments, the optoelectronic semiconductor chip is a radiation-emitting optoelectronic semiconductor chip such as a light-emitting diode chip. The optoelectronic semiconductor chip is designed to generate light during normal operation. It is possible that the optoelectronic semiconductor chip generates light in the spectral range of UV radiation to infrared radiation. In particular, the optoelectronic semiconductor chip is designed to generate electromagnetic radiation in the visible wavelength range during normal operation.

According to at least one embodiment of the optoelectronic semiconductor chip, the optoelectronic semiconductor chip comprises a semiconductor body which comprises a first semiconductor structure, a second semiconductor structure and an active region between the first and the second semiconductor structure. The first semiconductor structure, the active region, and the second semiconductor structure are stacked in a vertical direction transverse to or perpendicular to their main extension plane. The semiconductor body comprises semiconductor materials, in particular compound semiconductor materials, which are epitaxially deposited on one another. For example, the first semiconductor structure is p-conducting and the second semiconductor structure is n-conducting. Alternatively, the first semiconductor structure can be n-conducting and the second semiconductor structure may be p-conducting. During normal operation of the optoelectronic semiconductor chip, the active region is supplied with current via the first and the second semiconductor structure, wherein electromagnetic radiation is generated in the active region. In particular, the active region comprises quantum well structures in which electromagnetic radiation is generated during normal operation.

According to at least one embodiment of the optoelectronic semiconductor chip, the optoelectronic semiconductor chip comprises a plurality of recesses, which each penetrate at least one of the semiconductor structures and the active region. The recesses extend transversely, in particular perpendicular, to a lateral plane of the semiconductor body. The recesses completely penetrate at least one of the semiconductor structures and the active region. The lateral plane is the plane which extends parallel to the main extension plane of the semiconductor body. The semiconductor chip comprises a plurality of recesses, that is to say at least ten, preferably at least 100, in particular at least 1000 recesses. For example, the recesses are arranged over the entire surface of the semiconductor structure in the lateral plane at regular intervals from each other. For example, the area fraction in which the active region is penetrated by recesses can be between 0.5% and 20% inclusive, in particular between 1% and 10% inclusive, of the area of the active region. In particular, the recesses do not form a photonic crystal for the electromagnetic radiation generated in the active region.

According to at least one embodiment of the optoelectronic semiconductor chip, a cover surface of the active region is a continuous surface. The cover surface of the active region is a part of the outer surface of the active region and in particular may be in direct contact with the first or the second semiconductor structure. For example, the cover surface of the active region has holes in the regions of the recesses. In this case, the cover surface is formed multiply continuously. Alternatively, the recesses can be arranged in the edge region of the optoelectronic semiconductor chip in the lateral plane. In this case, the recesses in lateral directions are not completely surrounded by the semiconductor body and the cover surface of the active region is designed simply continuously.

According to at least one embodiment of the optoelectronic semiconductor chip, at least in some of the recesses, surfaces of the recesses are completely covered with electrically insulating material. The surfaces of the recesses are the surfaces that arise through the arrangement of the recesses in the semiconductor body and which limit the recesses. The surfaces of the recesses are formed by the parts of the semiconductor body, which are penetrated by the recesses. Thus, the surfaces of the recesses may be formed by the material of the first semiconductor structure, the second semiconductor structure or the active region. The surfaces of a recess each include the flanks—that is, the side surface or the side surfaces—and the bottom surface of the recess. The recesses may, for example, extend cylindrically into the semiconductor body. The surface of a recess is then formed by the lateral surface and the bottom surface.

The surfaces of the recesses may be completely covered with the electrically insulating material. That is, in the recesses, the semiconductor body is then exposed at no point and is not freely accessible from the recesses. In particular, the recesses may be completely filled with the electrically insulating material, so that no electrically conductive material is disposed within the recesses.

According to at least one embodiment, the optoelectronic semiconductor chip comprises a semiconductor body with a first semiconductor structure, a second semiconductor structure and an active region between the first and the second semiconductor structure. Furthermore, the optoelectronic semiconductor chip comprises a plurality of recesses, which each penetrate at least one of the semiconductor structures and the active region. In this case, a cover surface of the active region is a continuous surface. In at least some of the recesses, the surfaces of the recesses are completely covered with electrically insulating material.

An optoelectronic semiconductor chip described here is based inter alia on the following considerations. The active region generally includes quantum well structures in which electromagnetic radiation is generated. The number of usable quantum well structures in the active region of light emitting diodes is limited to a few, in particular less than ten, quantum well structures, since a uniform distribution of charge carriers on the quantum well structures is otherwise impossible. The quantum well structures are generally supplied with current sequentially, so that a uniform distribution of the charge carriers on the quantum well structures requires that the charge carriers pass through several quantum well structures at least partially. However, the potential profile in a quantum well structure restricts the mobility of charge carriers, so that, for example, as the distance from the p-conducting semiconductor structure increases, the density of positive charge carriers in the quantum well structures decreases significantly. An uneven distribution of charge carriers on the quantum well structures reduces the efficiency of the optoelectronic semiconductor chip, since in quantum well structures with low charge carrier density, the current density is too low to generate electromagnetic radiation with maximum efficiency. If the charge carrier density in quantum well structures is too high, the efficiency of the optoelectronic semiconductor chip is adversely affected, for example, because of the Auger effect.

Among other things, the optoelectronic semiconductor chip described here makes use of the idea of distributing the charge carriers uniformly over the quantum well structures in order to operate all quantum well structures with maximum efficiency possible. The semiconductor body has, in the active region, barrier layers which are arranged between the quantum well structures. The barrier layers have a first energy level, which is the highest energy level of the valence band. Furthermore, the semiconductor body has in a quantum well structure a third energy level, which is the lowest energy level of the quantized hole states.

It has now surprisingly been found that it is possible by the arrangement of the recesses in the semiconductor body to provide a second energy level at the interface between recesses and semiconductor body. That is, the recesses are arranged in the semiconductor body to produce a second energy level at the semiconductor body. For example, the recesses are etched into the semiconductor body, so that damage to the near-surface regions of the semiconductor body occur. The damage leads to the additional second energy level, which lies between the first and the third energy level. The quantum well structures can be supplied with current via the second energy level. The second energy level is arranged spatially in a region which adjoins the active region, in particular the quantum well structures. As a result, the charge carriers can reach all quantum well structures without passing through further quantum well structures, which reduces their mobility.

Advantageously, the charge carriers are uniformly distributed to the quantum well structures by means of the second energy level. As a result, the charge carrier density in the individual quantum wells is the same, so that all quantum well structures can be operated with maximum efficiency. Thus, the efficiency maximum of the entire optoelectronic semiconductor chip is shifted towards higher current densities. This increases the efficiency of the optoelectronic semiconductor chip, with keeping the area, and thus costs, fixed.

According to at least one embodiment of the optoelectronic semiconductor chip, the electrically insulating material is a dielectric or gaseous. The electrically insulating material may comprise, for example, a ceramic material or a polymer material. Alternatively, the electrically insulating material may be gaseous and may comprise, for example, air or an inert gas, for example, argon. In particular, in the region in which the gas is arranged, there can be a lower pressure than the ambient pressure. For example, the pressure may be so low that there is some sort of vacuum in this region.

For example, the electrically insulating material can be a material that is reflective or transparent to the electromagnetic radiation generated in the active region. In particular, it is possible that the electrically insulating material comprises a conversion material which converts the electromagnetic radiation generated during normal operation into radiation of a longer wavelength. The electrically insulating material is, for example, by means Atomic Layer Deposition, short: ALD, Plasma Enhanced Chemical Vapor Deposition, short: PECVD, Physical Vapor Deposition, short: PVD or Metalorganic Vapor Phase Epitaxy, short: MOVPE, applied respectively introduced into the recess.

According to at least one embodiment of the optoelectronic semiconductor chip, the active region comprises a multiplicity of five or more quantum well structures. For example, the active region comprises more than ten, in particular more than 15 quantum well structures. The quantum well structures have a main extension plane that extends fundamentally parallel or parallel to the main extension plane of the active region. All quantum well structures of the plurality of quantum well structures are completely penetrated transversely to their main extension plane by at least one of the recesses. Advantageously, a particularly large number of quantum well structures can be arranged in the active region, since they can be supplied with current particularly uniformly over the surfaces of the recesses. As a result, the maximum efficiency of the optoelectronic semiconductor chip is shifted in the direction of a higher current density, for example, a current density of 50 A/cm$^2$.

According to at least one embodiment of the optoelectronic semiconductor chip, the wavelength of the electromagnetic radiation generated in the active region is longer than 460 nm. In particular, the wavelength of the electromagnetic radiation generated in the active region lies in the green wavelength range. For example, the semiconductor material comprising the semiconductor body is an indium gallium nitride-based material. Advantageously, in this material system, the second energy level generated by the recess lies between mentioned first and third energy levels.

According to at least one embodiment of the optoelectronic semiconductor chip, the semiconductor structure, which is completely penetrated by the recesses, is p-conducting. For example, the recesses are produced by etching the p-conducting region in the direction of the n-conducting region. Due to the polarity of the semiconductor material and the sloped flanks of the recesses produced by etching, the flanks of the recesses are gallium-polar. Advantageously, the gallium-polar flanks produced by means of etching have a second energy level in the region of the recesses, which lies between the first and third energy level.

According to at least one embodiment of the optoelectronic semiconductor chip, the recesses have traces of an etching process. That is, the recesses are produced by etching and produced in an etching process. The etching process may be, for example, a dry chemical etching process. In this case, for example, the semiconductor structure, which is p-conducting, is etched from the side facing away from the active region in the direction of the active region. Advantageously, gallium-polar surfaces are generated particularly efficiently which have a second energy level which lies between the first and the third energy level.

The traces of the etching process are clearly distinguishable from alternative ways of production by conventional analysis methods of semiconductor technology. Thus, the feature that the recesses are created by etching is an objective feature that is clearly detectable on the finished product as well.

According to at least one embodiment of the optoelectronic semiconductor chip, the recesses also partially penetrate into the semiconductor structure, which is not completely penetrated by the recesses. The recesses protrude at least partially into the semiconductor structure, which is not completely penetrated by the recesses, so that this semiconductor structure forms both the bottom surface and part of the flanks of the recesses. In particular, the recesses can completely penetrate the semiconductor body perpendicular to its main extension plane.

According to at least one embodiment of the optoelectronic semiconductor chip, the semiconductor body has at least one second energy level which lies between a first and a third energy level. Here, the first energy level is the highest energy level of the valence band in the active region outside a quantum well structure, and the third energy level is the lowest energy level of the quantized hole states in a quantum well structure of the active region. The semiconductor body has the second energy level, in particular in the region of the flanks of the recesses. This region of the recesses directly adjoins the active region, in particular the quantum well structures. The region in which the semiconductor body has the second energy level arises only when the recesses are produced in the semiconductor body. Advantageously, the second energy level not only enables the quantum well structures to be supplied with current sequentially, but also to supply the positive charge carriers with current over the region which has the second energy level and adjoins the quantum well structure. Advantageously, a multiplicity of quantum well structures can thereby be supplied with current particularly uniformly, so that the positive charge carrier density in the individual quantum well structures is as equal as possible. In addition, non-sequential current supply allows a distribution of the positive charge carriers on a particularly large number of quantum well structures, so that the efficiency maximum of the optoelectronic device is shifted by increasing the number of quantum well structures in the direction of higher current densities.

According to at least one embodiment of the optoelectronic semiconductor chip, the semiconductor body has at least one further second energy level which lies between a further first and a further third energy level. The further first energy level is the most favorable energy level of the conduction band in the active region outside a quantum well structure, and the further third energy level is the most favorable energy level of the quantized electron states in a quantum well structure of the active region. The semiconductor body has the further second energy level, in particular in the region of the flanks of the recesses. This region of the recesses directly adjoins the active region, in particular the quantum well structures. The region in which the semiconductor body has the further second energy level arises only when the recesses are produced in the semiconductor body. Advantageously, the further second energy level not only enables the quantum well structures to be supplied with current sequentially, but also to supply the negative charge carriers with current over the region which has the further second energy level and adjoins the quantum well structure. Advantageously, a multiplicity of quantum well structures can thereby be applied with current particularly uniformly, so that the negative charge carrier density in the individual quantum well structures is as equal as possible. In addition, non-sequential current supply allows a distribution of the negative charge carriers to a particularly large number of quantum well structures, so that the efficiency maximum of the optoelectronic device is shifted by increasing the number of quantum well structures in the direction of higher current densities.

BRIEF DESCRIPTION OF THE DRAWINGS

Advantageous embodiments and developments of the optoelectronic semiconductor chip will become apparent from the exemplary embodiments described below in association with the figures.

In the figures:

FIGS. 1A and 1B show sectional views of an optoelectronic semiconductor chip according to a first exemplary embodiment;

FIGS. 4 and 5 show exemplary schematic sectional views of recesses in an optoelectronic semiconductor chip;

Figure 2:
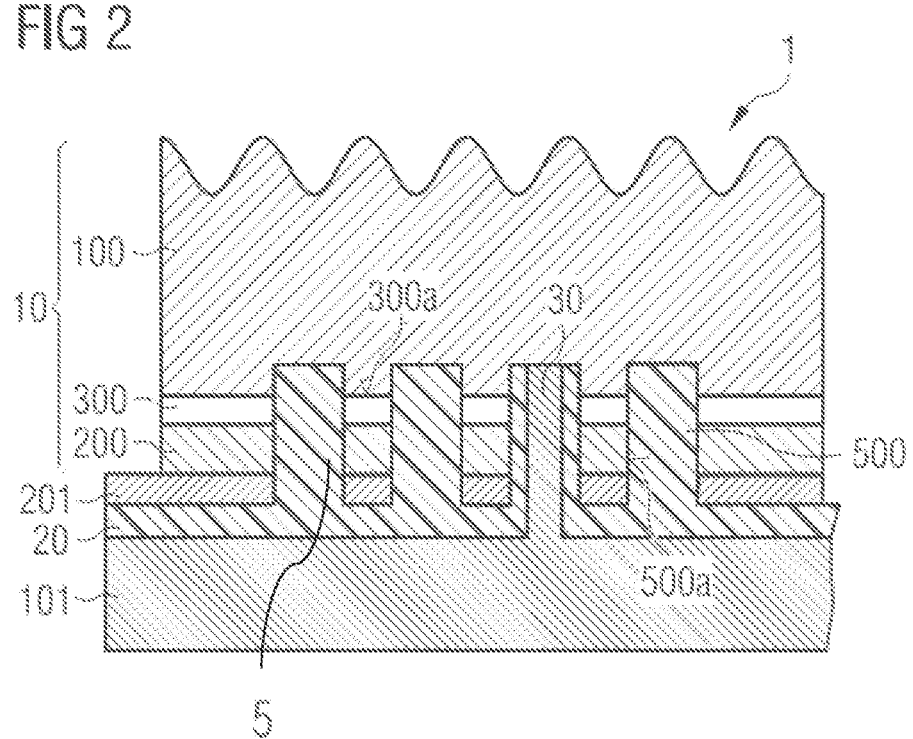
FIG. 2 shows a sectional view of an optoelectronic semiconductor chip according to a second exemplary embodiment.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

FIG. 1A shows a schematic sectional view of an optoelectronic semiconductor chip 1 described here according to a first exemplary embodiment. The optoelectronic semiconductor chip 1 comprises a semiconductor body 10 which comprises a first semiconductor structure 100, a second semiconductor structure 200 and an active region 300. The active region 300 is arranged between the first 100 and the second 200 semiconductor structure. The semiconductor body 10 also has a VIA 30, which completely penetrates the second semiconductor structure 200 and the active region 300 perpendicular to its main extension plane. In the region of the VIA 30, a first contact structure 101 is arranged, via which the first semiconductor structure 100 is contacted in an electrically conductive manner. In direct contact with the second semiconductor structure 200, a second contact structure 201 is arranged, via which the second semiconductor structure is contacted in an electrically conductive manner.

During operation of the optoelectronic semiconductor chip 1, the semiconductor body 10 is supplied with current via the first 101 and the second 201 contact structure. The first contact structure 101 is electrically insulated from the active region 300 of the second semiconductor structure 200 and the second contact structure 201 by means of an insulation layer 20.

In the semiconductor body 10 recesses 500 are arranged, which completely penetrate the first semiconductor structure 100 and the active region 300 perpendicular to its main extension plane. Further, the recesses 500 also partially penetrate into the second 200 semiconductor structure. The recesses 500 have flanks 500a that are completely covered by electrically insulating material. The electrically insulating material may be, for example, gaseous, in particular air.

A cover surface 300a of the active region 300 is designed to be multiply continuous in this exemplary embodiment. In a lateral plane, parallel to the main extension plane of the semiconductor body 10, the recesses 500 are completely surrounded by the semiconductor body 10.

The recesses have, for example, a diameter of 2 μm and a depth of 5 μm. In this case, the recesses are on average 10 microns apart. In particular, adjacent recesses at least 500 nm, preferably at least 2 μm, spaced from each other. For example, the recesses may be arranged non-periodically along lateral directions. The recesses may, for example, have a minimum diameter of 2 µm, in particular 10 µm.

FIG. 1B shows a detail of an optoelectronic semiconductor chip 1 according to the first exemplary embodiment described here in a schematic sectional view. In the section, the region of the semiconductor body 10 is shown, in which a recess 500 is arranged. The active region comprises a plurality of quantum well structures 3, in which electromagnetic radiation is generated during operation of the optoelectronic semiconductor chip 1. In the region of the quantum well structures 3, the semiconductor body 10 has quantized energy states whose highest energy state for positive charge carriers corresponds to a third energy level E3a. In the active region 300 outside the quantum well structures 3, the semiconductor body 10 has a material whose highest energy level in the valence band corresponds to a first energy level E1a. In the region of the surface 500a of the recesses 500, the material of the semiconductor body has a second energy level E2a, which lies between the first energy level E1a and the third energy level E3a. Spatially, the flank is adjacent both to regions of the semiconductor body that have the first energy level E1a and to regions that have the third energy level E3a.

For negative charge carriers, the semiconductor body 10 has quantized energy states in the region of the quantum well structures 3 whose lowest energy state corresponds to a further third energy state E3b. In the active region 300 outside the quantum well structures 3, the semiconductor body has a material whose lowest energy level in the conduction band corresponds to a further first energy level E1b. In the region of the surface 500a of the recesses 500, the material of the semiconductor body has a further second energy level E2b, which lies between the further first energy level E1b and the further third energy level E3b. Spatially, the flank adjoins both regions of the semiconductor body that have the further first energy level E1b and regions that have the further third energy level E3b.

During operation of the optoelectronic semiconductor chip, the active region 300 is supplied witch current via the first 100 and the second 200 semiconductor structure. During operation, the charge carriers 11 not only reach the individual quantum well structures 3 sequentially but can also enter the quantum well structures 3 over the region of the flank 500a. As a result, a particularly uniform distribution of the charge carriers on the quantum well structures 3 is achieved.

FIG. 2 shows a schematic sectional view of an optoelectronic semiconductor chip 1 described here according to a second exemplary embodiment. The optoelectronic semiconductor chip 1 comprises a semiconductor body 10 having a first semiconductor structure 100, a second semiconductor structure 200 and an active region 300. Furthermore, the optoelectronic semiconductor chip comprises a first contact structure 101, a second contact structure 201 and an insulation layer 20. The first contact structure 101 is electrically conductively connected to the first semiconductor structure 100 via a VIA 30. The VIA 30 penetrates the second contact structure, the second semiconductor structure and the active region 300 completely perpendicular to its main extension plane. The second contact structure 201 is in direct electrical contact with the second semiconductor structure 200. The semiconductor body can be supplied with current via the first contact structure 101 and the second contact structure 201 so that electromagnetic radiation is generated in the active region 300 during normal operation. Furthermore, the optoelectronic semiconductor chip 1 has recesses 500. The recesses 500 completely penetrate the second semiconductor structure 200 and the active region 300 perpendicular to its main extension plane, and partially penetrate the first semiconductor structure 100. The recesses 500 have flanks 500a, which are completely covered with electrically insulating material, in particular the insulating layer 20. In particular, the recesses 500 are completely filled with the material of the insulating layer 20. Furthermore, the insulation layer 20 is arranged in the region of the VIA 30 so that the first contact structure 101 is not in direct contact with the active layer and the second semiconductor structure 200.

The active region 300 has a cover surface 300a, which is designed continuously. The cover surface extends parallel to the main extension plane of the active region and is designed, for example, simply or multiply continuously. The active region may, for example, have a multiplicity of quantum well structures 3. For example, the active region has more than five, in particular more than ten quantum well structures.

The optoelectronic semiconductor chip has quantized energy states in the region of the quantum well structures whose highest energy state for positive charge carriers corresponds to the third energy level E3a. In the active region 300 outside the quantum well structures 3, the semiconductor body 10 has a material whose highest energy level in the valence band corresponds to the first energy level E1a. In the region of the surface 500a of the recesses 500, the material of the semiconductor body has a second energy level E2a which lies between the first energy level E1a and the third energy level E3a. In the area of the surface 500a of the recesses 500, the material of the semiconductor body has a further second energy level E2b, which lies between the further first energy level E1b and the further third energy level E3b.

Figure 3A:
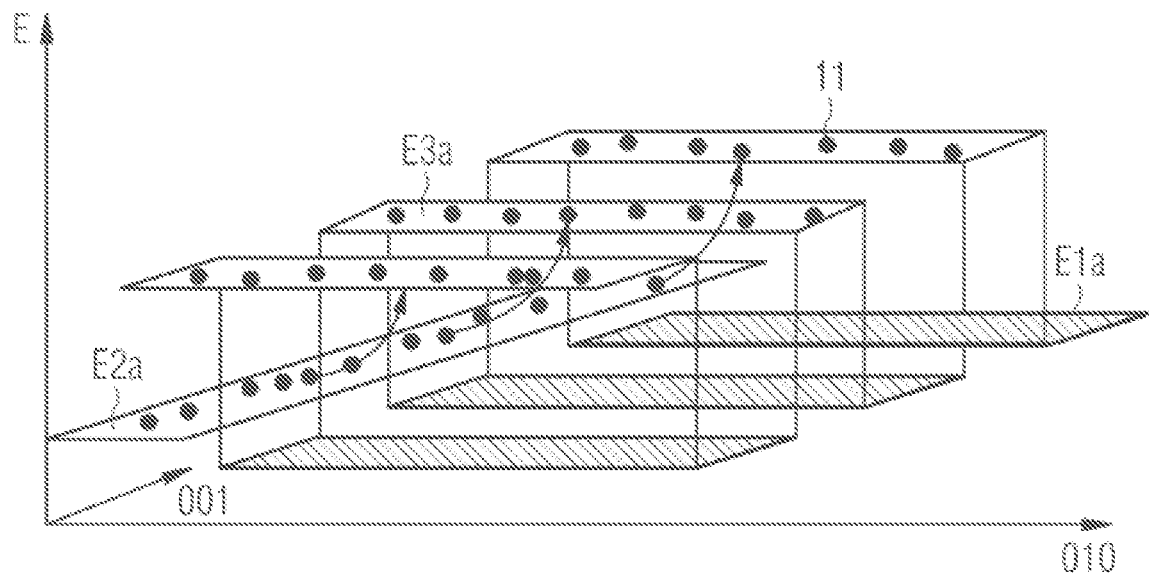
FIGS. 3A and 3B show examples of an energy diagram of the active region of an optoelectronic semiconductor chip.

FIG. 3A shows an energy diagram of the active region 300 of an optoelectronic semiconductor chip 1 described here. For the sake of clarity, only positive charge carriers and associated energy levels are shown. The first direction 001 in the diagram runs perpendicular to the normal vector of the surface resulting from the flank 500a and perpendicular to the main extension plane of quantum well structures 3 of the optoelectronic semiconductor chip 1. The second direction 010 runs along the main extension direction of the active region 300. The axis standing perpendicular to the first direction 001 and to the second direction 010 of the energy diagram describes the energy E of charge carriers in arbitrary units. Exemplary possible energy levels for positive charge carriers 11, i.e., holes, in an active region 300 of the semiconductor body 10 are shown in the energy diagram. The first energy level E1a represents the highest energy level of the valence band in the active region 300 outside of quantum well structures 3. The second energy level E2a is assigned to the region of the flank 500a of a recess 500 in the optoelectronic semiconductor chip 1. In particular, the second energy level E2a arises in the region of the flank 500a with the generation of the recess 500 in the semiconductor body 10. The third energy level E3a corresponds to the energetically most favorable quantized energy level for positive charge carriers within the quantum well structure 3 of the optoelectronic semiconductor chip 1.

Energetically, the second energy level E2a lies between the first energy level E1a and the third energy level E3a. Spatially, the region in which the semiconductor body has the second energy level E2a adjoins directly to regions in which the semiconductor body 10 has the first energy level E1a and the third energy level E3a. During operation of the optoelectronic semiconductor chip 1, charge carriers pass from the region of the first energy level E1a over the region of the second energy level E2a into the region of the third energy level E3a.

During normal operation of the optoelectronic semiconductor chip, the charge carriers shown here move on average in the first direction 001. Advantageously, the quantum well structures 3, which have the third energy level E3a, are not exclusively occupied sequentially with charge carriers 11. Instead, the charge carriers 11 are distributed uniformly over the region of the flank 500a of the recess 500, with the energy level E2a, onto the quantum well structures 3. This results in a uniformly distributed charge carrier density over the entirety of the quantum well structures 3. Advantageously, all quantum well structures 3 can thus be operated with a current density in the maximum efficiency range, for example, 50 A/cm$^2$.

Figure 3B:
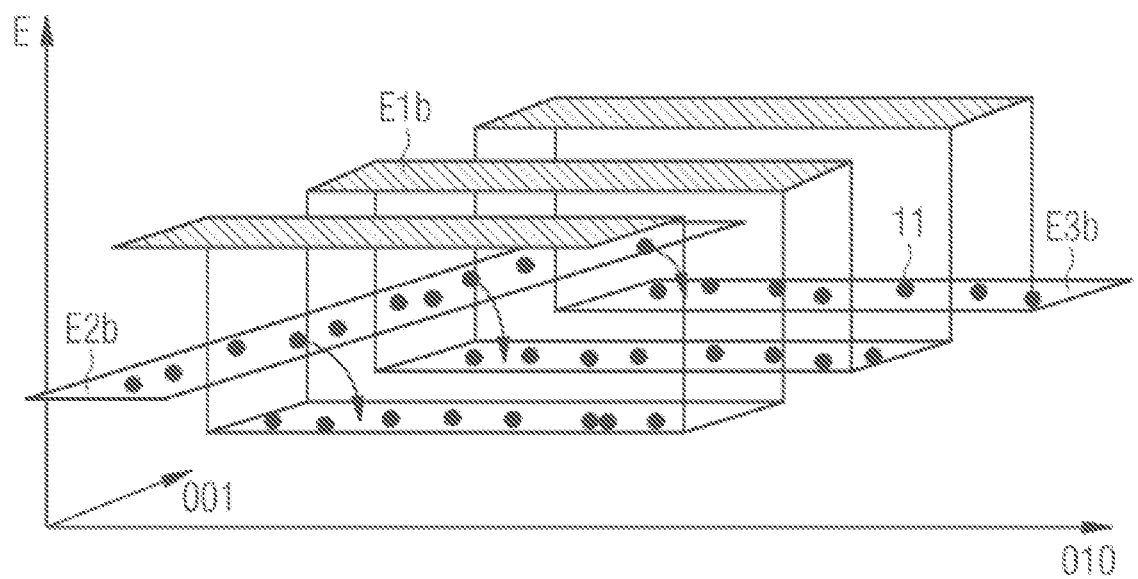

FIG. 3B shows an energy diagram of the active region 300 of an optoelectronic semiconductor chip 1 described here. For the sake of clarity, only negative charge carriers and associated energy levels are shown.

The first direction 001 in the diagram runs perpendicular to the normal vector of the surface resulting from the flank 500a and perpendicular to the main extension plane of quantum well structures 3 of the optoelectronic semiconductor chip 1. The second direction 010 runs along the main extension direction of the active region 300. The axis standing perpendicular to the first direction 001 and to the second direction 010 of the energy diagram describes the energy E of carriers in arbitrary units. Exemplary possible energy levels for negative charge carriers 11, i.e., electrons, in an active region 300 of the semiconductor body 10 are shown in the energy diagram. A further first energy level E1b represents the energetically most favorable energy level of the conduction band in the active region 300 outside quantum well structures 3. A further second energy level E2b can be assigned to the region of the flank 500a of a recess 500 in the optoelectronic semiconductor chip 1. In particular, the further second energy level E2b arises in the region of the flank 500a with the generation of the recess 500 in the semiconductor body 10. A further third energy level E3b corresponds to the energetically most favorable quantized energy level for electrons within the quantum well structure 3 of the optoelectronic semiconductor chip 1.

Energetically, the further second energy level E2b lies between the further first energy level E1b and the further third energy level E3b. Spatially, the region in which the semiconductor body has the further second energy level E2b directly adjoins regions in which the semiconductor body 10 has the further first energy level E1b and the further third energy level E3b. During operation of the optoelectronic semiconductor chip 1, negative charge carriers pass from the region of the further first energy level E1b over the region of the further second energy level E2b into the region of the further third energy level E3b.

During normal operation of the optoelectronic semiconductor chip, the negative charge carriers 11 shown here move on average in the first direction 001. Advantageously, the quantum well structures 3, which have the further energy level E3b, are not exclusively occupied sequentially with charge carriers 11. Instead, the charge carriers 11 are distributed uniformly over the region of the flank 500a of the recess 500, with the further second energy level E2b, onto the quantum well structures 3. This results in a uniformly distributed charge carrier density over the entirety of the quantum well structures 3. Advantageously, all quantum well structures 3 can thus be operated with a current density in the maximum efficiency range, for example, 50 A/cm$^2$.

FIG. 4 shows a schematic sectional view of an exemplary embodiment of a recess 500 which is arranged in a semiconductor body 10. The semiconductor body 10 comprises a first semiconductor structure 100, a second semiconductor structure 200 and an active region 300. The active region is arranged between the first semiconductor structure 100 and the second semiconductor structure 200. For example, the first semiconductor structure 100 is a structure formed of a p-conducting material. In this case, the second semiconductor structure 200 is formed of an n-conducting material. The recess 500 completely penetrates the first semiconductor structure 100 and the active region 300 perpendicular to its main extension plane. The recess 500 has a flank 500a, which is completely covered by insulating material, in particular air. The semiconductor body 10 is arranged on a carrier 40. In this case, a cover surface 300a of the active region 300 is designed continuously.

FIG. 5 shows a sectional view of a semiconductor body 10 with an alternative embodiment of a recess 500. In contrast to the embodiment shown in FIG. 5, the recess 500 completely penetrates the semiconductor body 10. In this case, a cover surface 300a of the active region 300 is designed to be continuous. The recess is, for example, completely filled with a gaseous insulating material, for example, air. In particular, all surfaces of the recess are completely covered by the insulating material.

Figure 6:
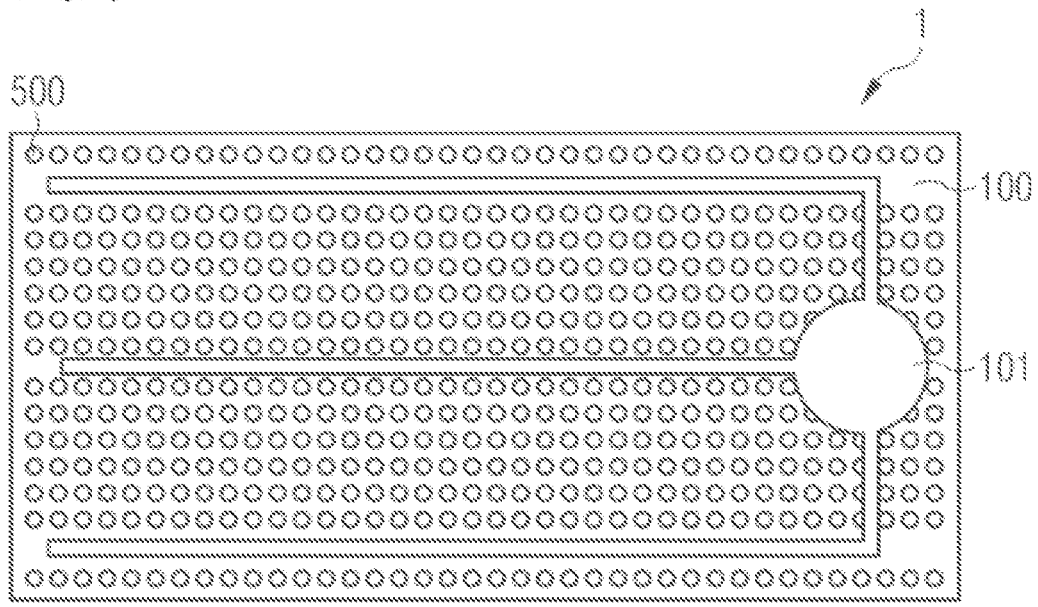
FIG. 6 shows the plan view of an optoelectronic semiconductor chip according to an exemplary embodiment.

FIG. 6 shows a schematic plan view of an optoelectronic semiconductor chip 1 described here according to an exemplary embodiment. The plan view shows a semiconductor structure 100 perpendicular to its main extension plane. On the surface of the semiconductor structure 100, a first contact structure 101 is arranged, via which the first semiconductor structure 100 is electrically conductively contacted and supplied with current. On its surface visible in plan view, the semiconductor body 10 has a plurality of recesses 500, which are arranged next to one another in the lateral plane. The recesses extend completely through the first semiconductor structure 100 and an underlying active region 300.

Figure 7A:
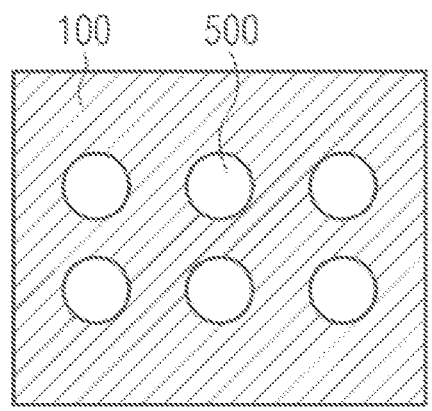
FIGS. 7A, 7B, 7C and 7D show schematic plan views of an optoelectronic semiconductor chip.

FIG. 7A shows a schematic plane view of an optoelectronic semiconductor chip 1 described here. The semiconductor structure 100 forms the top side of the optoelectronic semiconductor chip 1. In the first semiconductor structure 100, recesses 500 are arranged, which completely penetrate the first semiconductor structure 100 and an underlying active region 300. In this exemplary embodiment, the recesses 500 have a circular contour parallel to the main extension plane of the first semiconductor structure 100.

Figure 7B:
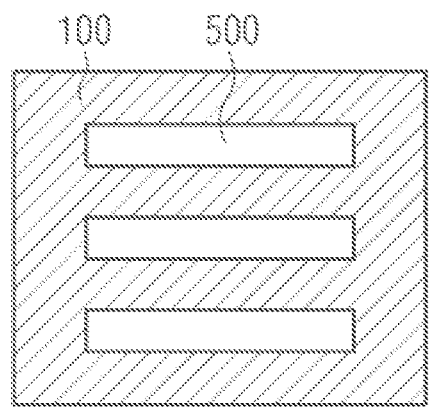

FIG. 7B shows an alternative exemplary embodiment of an optoelectronic semiconductor chip 1 described here, whose top side is formed by a first semiconductor structure 100. In the first semiconductor structure 100, a plurality of recesses 500 are arranged, which completely penetrate the first semiconductor structure 100 and the active region 300 perpendicular to its main extension plane. The recesses 500 have a rectangular contour parallel to the main extension plane of the first semiconductor structure 100.

Figure 7C:
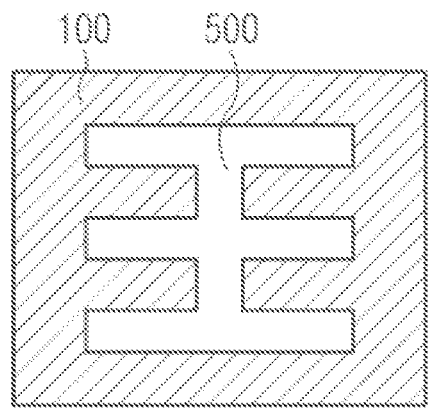

FIG. 7C shows an alternative exemplary embodiment of an optoelectronic semiconductor chip 1 described here, whose top side is formed by a first semiconductor structure 100. A recess 500 penetrates the first semiconductor structure 100 and the underlying active region 300 perpendicular to its main extension plane completely. In this embodiment, the recess parallel to the main extension plane of the semiconductor body 10 has any polygonal contour.

Figure 7D:
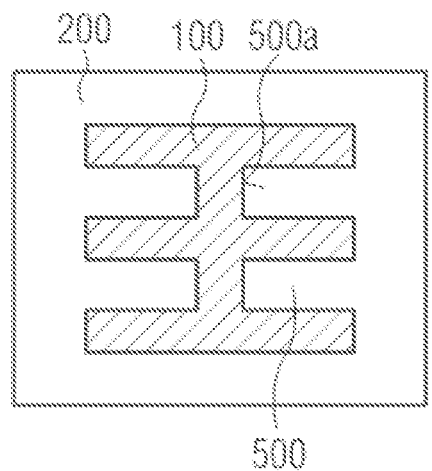

FIG. 7D shows an alternative embodiment of an optoelectronic semiconductor chip 1 described here in a schematic plan view. The top side of the optoelectronic semiconductor chip is formed by a first semiconductor structure 100. In the first semiconductor structure 100, a recess 500 is arranged, which completely penetrates the first semiconductor structure 100 and an underlying active region 300 perpendicular to its main extension plane. The recess 500 completely surrounds the first semiconductor structure 100 parallel to its lateral plane. The recess 500 may have any polygonal contour in the lateral plane.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic semiconductor chip comprising:
a semiconductor body comprising a first semiconductor structure, a second semiconductor structure and an active region between the first and second semiconductor structures; and
at least 1000 recesses, each recess penetrating at least one of the semiconductor structures and the active region,
wherein a cover surface of the active region is a continuous surface,
wherein at least in some of the recesses, surfaces of the recesses are completely covered with an electrically insulating material,
wherein the recesses are arranged over an entire surface of a first or second semiconductor structure in a lateral plane at regular intervals, and
wherein the semiconductor body comprises a via completely penetrating the second semiconductor structure and the active region perpendicular to its main extension plane.

2. The optoelectronic semiconductor chip according to claim 1, wherein the electrically insulating material is a dielectric material.

3. The optoelectronic semiconductor chip according to claim 1, wherein the active region comprises a plurality of five or more quantum well structures.

4. The optoelectronic semiconductor chip according to claim 1, wherein the active region is configured to generate electromagnetic radiation with a wavelength longer than 460 nm.

5. The optoelectronic semiconductor chip according to claim 1, wherein the first or second semiconductor structure, which is completely penetrated by the recesses, is p-conducting.

6. The optoelectronic semiconductor chip according to claim 1, wherein the surfaces of the recesses have traces of an etching process.

7. The optoelectronic semiconductor chip according to claim 1, wherein the recesses partially penetrate into the first or second semiconductor structure, which is not completely penetrated by the recesses.

8. The optoelectronic semiconductor chip according to claim 1, wherein the active region has at least one second energy level which lies energetically between a first energy level and a third energy level, and wherein the first energy level is the most energetically favorable energy level of a valence band in the active region outside a quantum well structure and the third energy level is the most energetically favorable energy level of quantized hole states in a quantum well structure of the active region.

9. The optoelectronic semiconductor chip according to claim 1, wherein the active region has at least one further second energy level, which lies energetically between a further first energy level and a further third energy level, and wherein the further first energy level is the most energetically favorable energy level of a conduction band in the active region outside a quantum well structure and the further third energy level is the most energetically favorable energy level of a quantized electron states in a quantum well structure of the active region.

10. A optoelectronic semiconductor chip comprising:
a semiconductor body comprising a first semiconductor structure, a second semiconductor structure and an active region between the first and second semiconductor structures; and
at least 1000 recesses, each recess penetrating at least one of the semiconductor structures and the active region,
wherein a cover surface of the active region is a continuous surface,
wherein the active region comprises a plurality of five or more quantum well structures,
wherein, at least in some of the recesses, surfaces of the recesses are completely covered with an electrically insulating material,
wherein the recesses are arranged over an entire surface of a first or second semiconductor structure in a lateral plane at regular intervals, and
wherein the semiconductor body comprises a via completely penetrating the second semiconductor structure and the active region perpendicular to its main extension plane.

11. An optoelectronic semiconductor chip comprising:
a semiconductor body comprising a first semiconductor structure, a second semiconductor structure and an active region between the first and second semiconductor structures; and
a plurality of recesses, each recess penetrating at least one of the first or second semiconductor structures and the active region,
wherein a cover surface of the active region is a continuous surface,
wherein at least in some of the recesses, surfaces of the recesses are completely covered with an electrically insulating material,
wherein an area fraction in which the active region is penetrated by recesses is at least 10% and at most 20% of an area of the active region, and
wherein the semiconductor body comprises a via completely penetrating the second semiconductor structure and the active region perpendicular to its main extension plane.

12. The optoelectronic semiconductor chip according to claim 11, wherein the electrically insulating material is a dielectric material.

13. The optoelectronic semiconductor chip according to claim 11, wherein the active region comprises a plurality of five or more quantum well structures.

14. The optoelectronic semiconductor chip according to claim 11, wherein the active region is configured to generate electromagnetic radiation with a wavelength longer than 460 nm.

15. The optoelectronic semiconductor chip according to claim 11, wherein the first or second semiconductor structure, which is completely penetrated by the recesses, is p-conducting.

16. The optoelectronic semiconductor chip according to claim 11, wherein the recesses partially penetrate into the first or second semiconductor structure, which is not completely penetrated by the recesses.

17. The optoelectronic semiconductor chip according to claim 11, wherein the active region has at least one second energy level which lies energetically between a first energy level and a third energy level, and wherein the first energy level is the most energetically favorable energy level of a valence band in the active region outside a quantum well structure and the third energy level is the most energetically favorable energy level of quantized hole states in a quantum well structure of the active region.

18. The optoelectronic semiconductor chip according to claim 11, wherein the active region has at least one further second energy level, which lies energetically between a further first energy level and a further third energy level, and wherein the further first energy level is the most energetically favorable energy level of a conduction band in the active region outside a quantum well structure and the further third energy level is the most energetically favorable energy level of a quantized electron states in a quantum well structure of the active region.

* * * * *